US008597986B2

(12) United States Patent
Wang et al.

(10) Patent No.: US 8,597,986 B2
(45) Date of Patent: Dec. 3, 2013

(54) SYSTEM IN PACKAGE AND METHOD OF FABRICATING SAME (75) Inventors: Tsung-Ding Wang, Tainan (TW); Chien-Hsiun Lee, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 27 days.

(21) Appl. No.: 13/223,428

(22) Filed: Sep. 1, 2011

(65) Prior Publication Data

US 2013/0056880 A1 Mar. 7, 2013

(51) Int. Cl.
*H01L 33/64* (2010.01)

(52) U.S. Cl.
USPC ........... 438/122; 438/106; 438/108; 438/118; 257/706; 257/720; 257/E23.051

(58) Field of Classification Search
USPC .................. 438/107, 118, 122, 106, 112, 123
See application file for complete search history.

(56) References Cited

U.S. PATENT DOCUMENTS

| 7,215,022 | B2 * | 5/2007 | Chan et al. | 257/724 |
| 7,295,480 | B2 * | 11/2007 | McPartland | 365/201 |
| 8,062,933 | B2 * | 11/2011 | Huang et al. | 438/122 |
| 8,097,490 | B1 * | 1/2012 | Pagaila et al. | 438/106 |
| 8,283,205 | B2 * | 10/2012 | Pagaila et al. | 438/106 |
| 2002/0168797 | A1 | 11/2002 | DiStefano et al. | |
| 2004/0245617 | A1 | 12/2004 | Damberg et al. | |
| 2008/0230883 | A1 | 9/2008 | Yee et al. | |
| 2009/0170241 | A1 * | 7/2009 | Shim et al. | 438/107 |

OTHER PUBLICATIONS

Brunnbauer M. et al., "An Embedded Device Technology Based on a Molded Reconfigured Wafer", Electronic Components and Technology Conference, 2006, pp. 547-551.
Yuan, T.D. et al., "Thermal Interface Material (TIM) Design Guidance for Flip Chip BGA Package Thermal Performance", Oct. 2004, 6 pages, www.altera.com/literature/cp/cp-01020.

* cited by examiner

*Primary Examiner* — Steven Loke
*Assistant Examiner* — David Goodwin
(74) *Attorney, Agent, or Firm* — Duane Morris LLP; Steven E. Koffs (57) ABSTRACT

An assembly has at least one integrated circuit (IC) die fixed in a medium. The assembly has a redistribution layer over the IC die. The redistribution layer has conductors connecting first pads on active faces of the IC die to second pads at an exposed surface of the assembly. A die unit is provided over the IC die. The die unit has a bottom die interconnected to a package substrate. Respective portions of the redistribution layer corresponding to each of the at least one IC die partially underlie the bottom die, and extend beyond the bottom die. The package substrate has contacts connected to the ones of the second pads corresponding to the at least one IC die.

20 Claims, 5 Drawing Sheets

SYSTEM IN PACKAGE AND METHOD OF FABRICATING SAME

FIELD

This disclosure relates to semiconductor fabrication generally, and more specifically to a system in package (SiP) and process flow for SiP

BACKGROUND

Flip chip packaging techniques have become more widely used in the semiconductor packaging field. The flip chip technique allows use of the entire active face of a semiconductor integrated circuit (IC) die for interconnections to the package substrate. This increases the density of pins relative to wire bonding. However, the density of contacts which can be formed on the package substrate has not increased as quickly as the density of the pads of the IC. Thus, the minimum pitch between contacts on the package substrate is greater than the minimum pitch between pads on the IC die.

The fan-out wafer form (also called a "reconfigured wafer") provides a solution to this problem. In this method, a wafer containing a plurality of IC dies is processed, tested, grinded and singulated. The active faces of the dies are arranged in a spaced out fashion on a release tape over a carrier substrate. The back face and side edges of the dice are encapsulated in a molding compound. The compound is cured. Then the carrier and release tape are removed. The resulting reconfigured wafer has dies with lanes of molding compound between the rows and columns of dies. The active face of the reconfigured wafer is also planar.

A redistribution layer is formed over the active face, partly overlying the dice and partly overlying the lanes of compound between the dice. The redistribution layer comprises a patternable dielectric material. Fan-out lines and vias are formed in the redistribution layer using photolithographic techniques. The top surface of the redistribution layer has a plurality of pads corresponding to the pads of the IC dies. The spacing between the pads at the top surface of the redistribution layer can thus be greater than the spacing on the active face of the die, so that some the pads of the redistribution layer are outside of the die area. Solder bumps are placed on the pads of the redistribution layer. The reconfigured wafer is then singulated, and the dies are connected to respective package substrates having a pad density lower than the pin density of the IC die.

DETAILED DESCRIPTION

This description of the exemplary embodiments is intended to be read in connection with the accompanying drawings, which are to be considered part of the entire written description. In the description, relative terms such as "lower," "upper," "horizontal," "vertical,", "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

Figure 6:
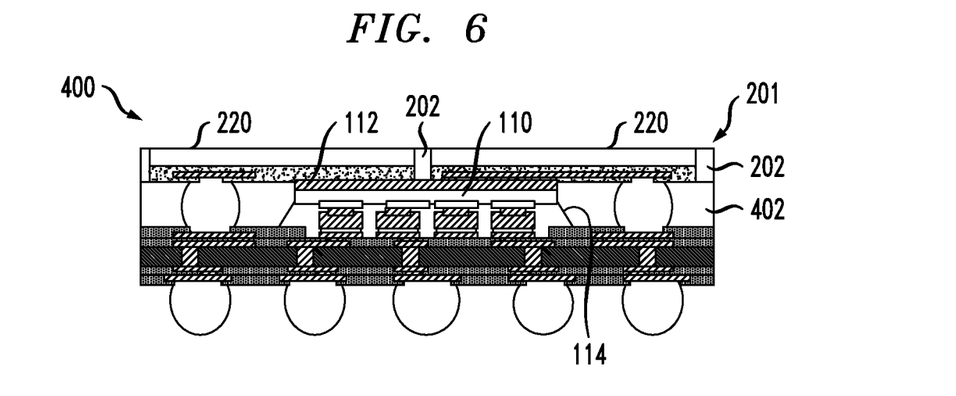
FIG. 6 shows the SiP of FIG. 5 after thinning the compound above the IC dies of the fan out wafer.
Figure 7:
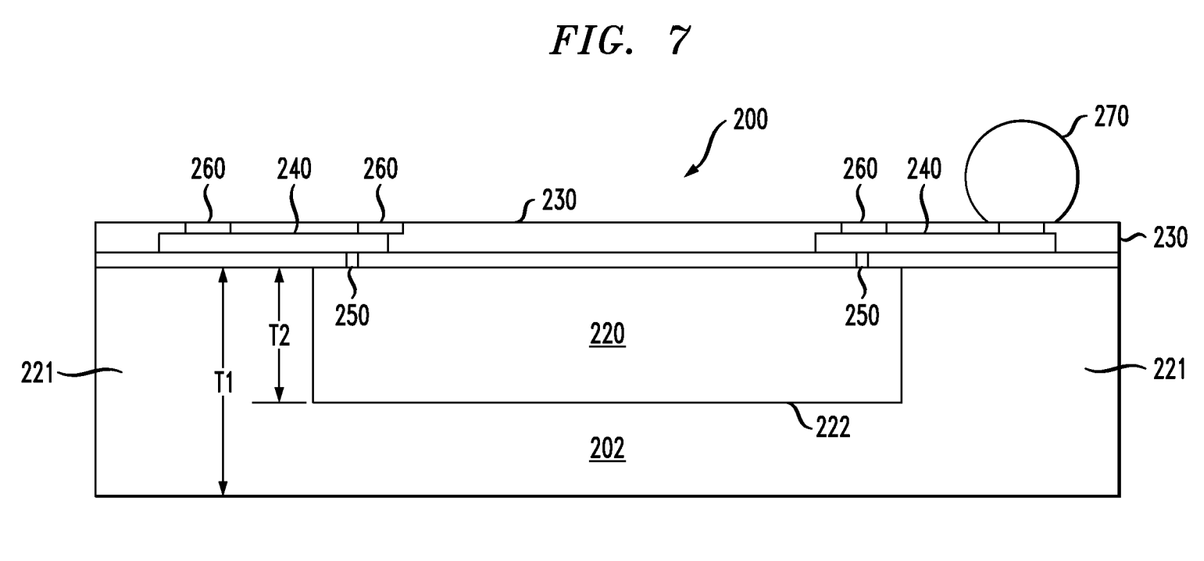
FIG. 7 is an enlarged detail of FIG. 2, showing a die within the fan-out wafer.
Figure 8A:
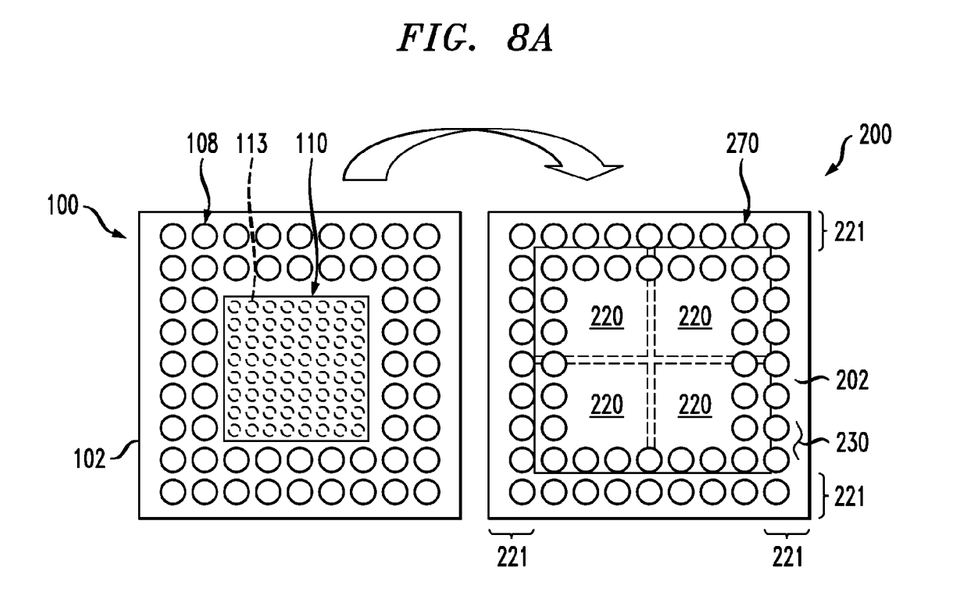
FIG. 8A is a plan view showing the die unit of FIG. 1 being flipped for connecting to the fan out wafer of FIG. 2.
Figure 8B:
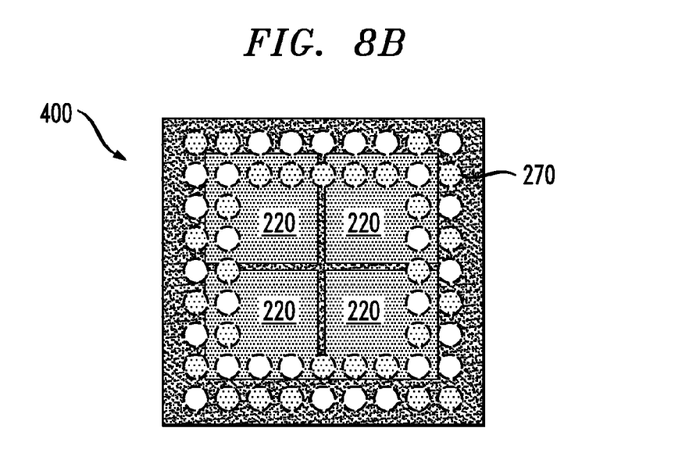
FIG. 8B is a top plan view of the SiP of FIG. 6.

FIGS. 6 and 8B show an example of a finished SiP 400. FIG. 6 is a cross sectional view, and FIG. 8B is a plan view. FIG. 7 is an enlarged detail showing a cross section of one of the dies 220, prior to thinning the molding compound 202 on the back face of the die 220 to expose the back faces of the dies 220 as shown in FIG. 8B.

The SiP structure 400 comprises an assembly 201 including at least one integrated circuit (IC) die 220 fixed in a medium (e.g., molding compound) 202. In the example, assembly 201 has a plurality of dies 220. The assembly 201 of dies 220 and medium 202 is provided from a fan-out wafer 200 (FIG. 2) having a redistribution layer 230 (FIG. 7) over the IC dies 220. The redistribution layer 230 has conductors 240 (including at least one of the group consisting of conductive patterns and vias) connecting first pads 250 on active faces of the IC dies to second pads 260 at an exposed surface of the fan-out wafer 200.

Referring again to FIGS. 6 and 8B, a die unit 100 (shown in detail in FIG. 1) is interconnected to one or more (in some embodiments, at least two) of the IC dies 220 of the fan assembly 201. The die unit 100 has a package substrate 102 and a bottom die 110 interconnected to the package substrate 102. Respective portions of the redistribution layer 230 corresponding to each of the at least two IC dies 220 partially underlie the bottom die 110, and extend beyond the bottom die. The package substrate 102 has contacts 108. The contacts 108 of the package substrate 102 are connected to the ones of the second pads 260 (of the redistribution layer 230) that are connected to the first pads 250 of the at least two IC dies 220. An underfill material 402 fills the space between the package substrate 102 and the IC dies 220.

FIG. 8B shows one example of a configuration of IC dies (e.g., memory dies) 220 connected to a bottom die (e.g., embedded processor or CPU) 110. The second die unit 100 (shown in FIG. 3) may be the same structure as the first die unit 100, and may be connected the same way, as described above. Each of the plurality of IC dies 220 is surrounded on four sides by lanes 221 of the medium 202 (e.g., molding compound). The solder balls 270 are shown in FIG. 8A as a example of a possible configuration of solder balls 270 (under which corresponding pads 260 are provided, as shown in FIG. 7). In this example, the pads 260 and solder balls 270 are arranged in an "L" configuration on each of the IC dies 220. The remaining region of each IC die 220 is without pads 260 or solder balls 270, and is adapted to confront the thermal interface material 112 of the corresponding die unit 100.

Although FIGS. 8A and 8B show a configuration of four IC dies 220 (a respective die 220 overlapping (extending beyond) each respective corner of the bottom die 210), any number of one or more dies 220 may be provided in the package 400. If more than four dies 220 are provided, some of the dies 220 overlap the side edges (but not corners) of the bottom die 110. If only one die 220 is included, that die 220 overlaps (extends beyond) all four corners of the bottom die 210.

Although FIGS. 8A and 8B shows four identical dynamic random access memory (DRAM) dies 220, the dies 220 may be a mix of different types. The dies 220 can include one or more of the group consisting of a general purpose processor (e.g., a system on chip or SoC), a graphics processor, an audio/video processor, a digital radio receiver, DRAM, SRAM, or flash memory, a communications processor (which may include a WiFi (802.11), Bluetooth, or broadband interface), a global positioning satellite (GPS) receiver, or other communications interface; a second processor and a power management unit.

Figure 9:
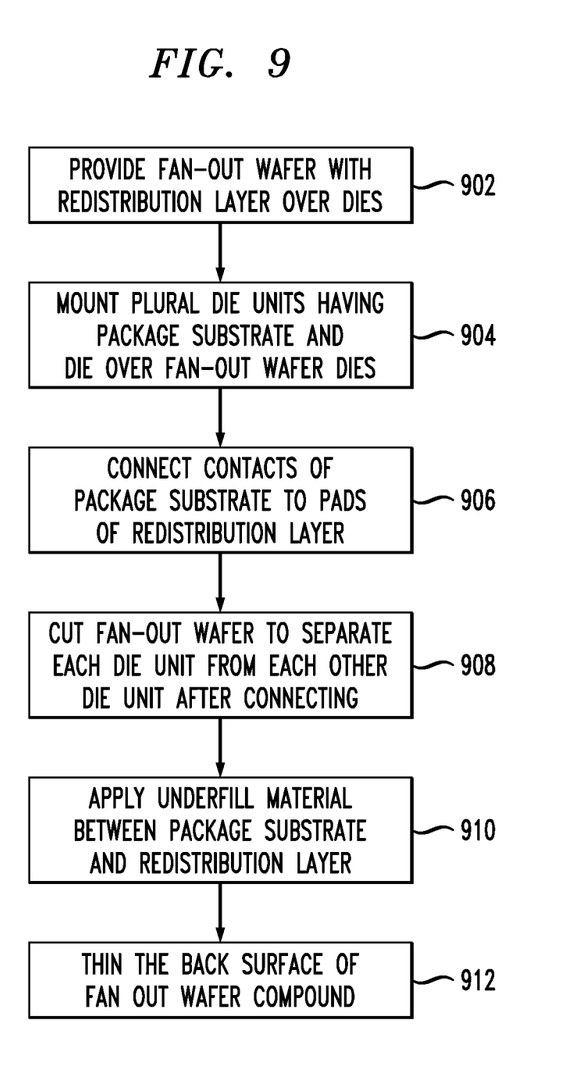
FIG. 9 is a flow chart of the method shown in FIGS. 2 to 6.

FIGS. 1 to 8B show the SiP at various stages of fabrication. FIG. 9 is a flow chart of the fabrication method.

Figure 1:
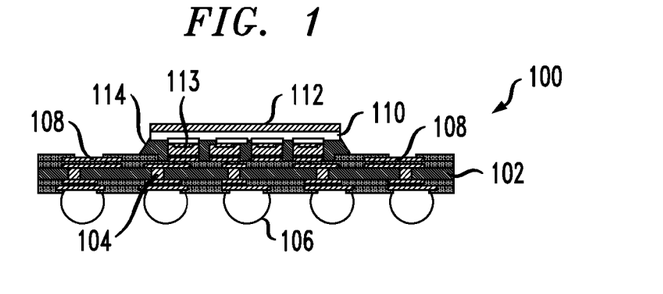
FIG. 1 is a cross-sectional diagram of a die unit.

FIG. 1 shows the die unit 100 including the package substrate 102 and bottom die 110. The bottom die 110 may be formed using any of a variety of substrate materials, such as silicon, SiGe, GaAs, or the like, and any of a variety of critical dimension sizes. Because the die unit 100 is fabricated separately, each bottom die 110 is verified (through wafer acceptance test and chip probe test) to contain a known good die.

The package substrate 102 comprises a dielectric layer 102 which may be made from a material such as FR-4 (Woven glass and epoxy), or other prepreg materials such as FR-2 (Phenolic cotton paper), FR-3 (Cotton paper and epoxy), FR-5 (Woven glass and epoxy), FR-6

(Matte glass and polyester), G-10 (Woven glass and epoxy), CEM-1 (Cotton paper and epoxy), CEM-2 (Cotton paper and epoxy), CEM-3 (Woven glass and epoxy), CEM-4 (Woven glass and epoxy), CEM-5 (Woven glass and polyester). In other embodiments, the package substrate 102 may be made from polytetrafluoroethylene. Package substrate 102 has a plurality of conductive patterns and vias, collectively labeled 104, for distributing signals and power between the bottom die 110 above and the solder balls 106 below.

The bottom die 110 may be flip chip mounted to the package substrate 102 by a plurality of solder balls 113. A thermal interface material (TIM) 112 is placed over the back surface of the bottom die 110. The TIM 112 may be printed or stenciled onto the dies 110 or applied as a TIM film, so that the die 110 is covered, but the contacts 108 of edge portions of the package substrate 102 remain exposed. The TIM 112 may be a soft polymer, such as a polyimide. An underfill material 114 is applied to fill the space between the package substrate 102 and the bottom die 110, and encapsulate the solder, copper posts or spacers between the substrate 102 and the die 110.

Figure 2:
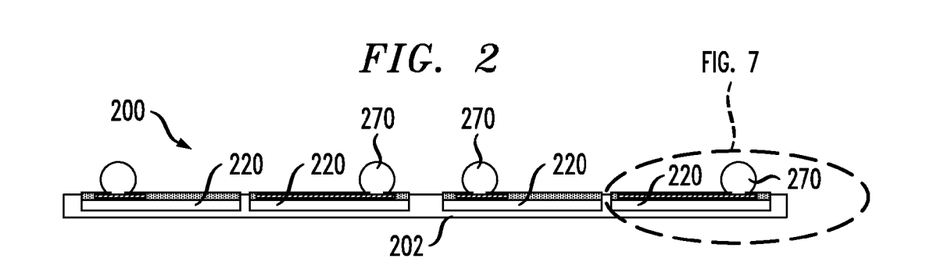
FIG. 2 is a cross-sectional diagram of a fan out wafer-level form ("reconfigured wafer").

At step 902 of FIG. 9, a fan-out wafer 200 is provided, having a redistribution layer 230 over a plurality of dies 220. FIG. 2 shows is a cross-sectional view of a portion of the fan-out wafer 200. The fan-out wafer 200 may be fabricated by a method described in M. Brunnbauer et al., "An Embedded Device Technology Based on a Molded Reconfigured Wafer," IEEE 2006 Electronic Components and Technology Conference, pp 547-551, 2006, which is incorporated by reference herein in its entirety. In one example of a method for making a fan-out wafer 200, one or more silicon wafers (not shown) containing a plurality of IC dies 220 is (are) processed, tested, grinded and singulated. Each IC die 220 is a known good die, having passed through chip probe testing.

The active faces of the dies 220 are arranged in a spaced out fashion on a release tape over a carrier substrate (not shown). The back face and side faces of the dice are encapsulated in a medium, such as a molding compound 202 or a thermosetting material. The compound 202 is cured. Then the carrier and release tape are removed. The resulting reconfigured wafer 200 has dies 220 with lanes of molding compound 202 between the rows and columns of dies. The active face of reconfigured wafer is also planar.

As shown in FIG. 7, a redistribution layer 230 is formed over the active face of the dies 220, partly overlying the dice 220 and partly overlying the lanes 221 of compound between the dice 220. The redistribution layer 230 comprises a patternable dielectric material. Conductors 240 (fan-out lines and vias) are formed in the redistribution layer 230 using photolithographic techniques. The top surface of the redistribution layer 230 has a plurality of second pads 260 corresponding to the first pads 250 of the IC dies 220. The density of the pads 260 is less than the density of the pads 250 on the active face of the die, and the average spacing between the pads 260 can thus be greater than the spacing of the pads 250. Thus, some the pads 260 of the redistribution layer 230 directly overlie the lane 221 outside of the area of die 220. Solder bumps 270, copper posts or conductive spacers are placed on the pads 260 of the redistribution layer 230.

In some embodiments, the fan-out wafer 200 has a thickness T1 greater than a thickness T2 of at least one of the IC dies 220, so that the back face 222 of one or more of the dies 220 is encapsulated by the medium 202 (e.g., molding compound). In other embodiments, the fan-out wafer 200 may be thinned by, for example grinding or chemical mechanical polishing the back face of wafer 200 until the back face of at least one, some or all of the IC dies 220 are exposed.

Although FIG. 2 only shows four dies 220, the full fan-out wafer 200 may include many (e.g., hundreds of) IC dies 220.

FIG. 8A shows the die unit 100 and the assembly (fan out wafer form) 200, ready to be combined. In FIG. 8A, the contacts 108 of the die unit 100 and the solder balls 270 of the wafer fan out form 200 are both facing upwards. Following the flipping, the contacts 108 of the die unit 100 will confront the solder balls 270 of the wafer fan out form 200.

Referring again to FIG. 9, at step 904, a plurality of die units 100 (as described above with reference to FIG. 1) are mounted over the IC dies 220 of the fan-out wafer 200. Each of the die units 100 is flipped as shown in FIG. 8A, so that the TIM layer 112 of each bottom die 110 confronts a portion of each of at least two IC dies 220. In some embodiments, the die units 100 are mounted so that each die unit 100 at least partially overlies two or more of the IC dies 220. Respective portions of the redistribution layer 230 corresponding to each of the at least two IC dies 220 partially underlies the bottom die 110, and extend beyond the bottom die 110.

At step 906, the contacts 108 of the package substrate 102 of each die unit 100 are connected to the respective first pads 250 of the at least two of the IC dies 220. In this example, the solder balls 270 are reflowed to form the mechanical and electrical interconnections between contacts 108 and second pads 260, which are in turn connected to the first pads 250 by way of the conductors 240 (e.g., lines and vias). If copper posts or conductive spacers are used, the mounting and connecting steps can be performed simultaneously upon placement of the bottom die 110, so that the TIM layer 112 confronts the back face of the bottom die 110, and the posts/spacers confront the contacts 108.

Figure 3:
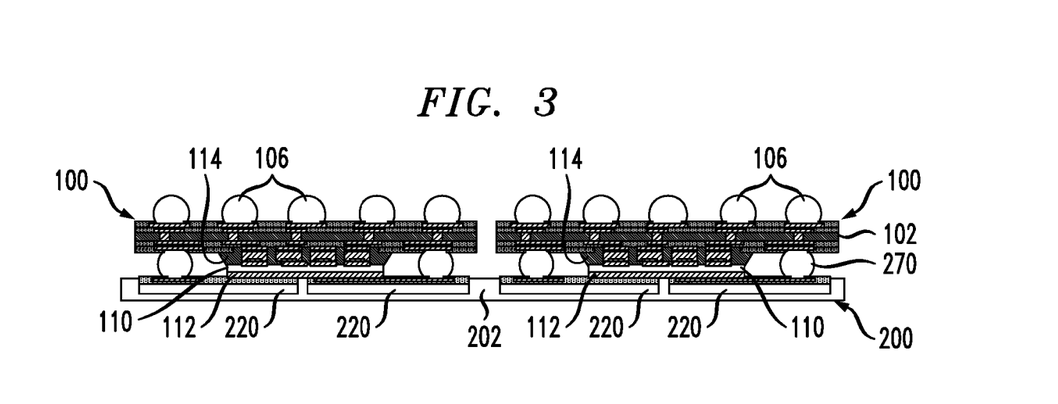
FIG. 3 is a cross-sectional diagram showing the die unit of FIG. 1 mounted on the fan out wafer of FIG. 2.

The resulting structure shown in FIG. 3 includes a fan-out wafer 200 having a plurality of integrated circuit (IC) dies 220 fixed in a medium 202. The fan-out wafer 200 has a redistribution layer 230 over the IC dies 220. The redistribution layer 230 has conductors 240 (including at least one of the group consisting of conductive patterns and vias) connecting first pads 250 on active faces of the IC dies to second pads 260 at an exposed surface of the fan-out wafer 200. A die unit 100 at least partially overlies at least two the IC dies 220 of the fan out wafer 200. The die unit 100 has a package substrate 102 and a bottom die 110 interconnected to the package substrate. Respective portions of the redistribution layer 230 corresponding to each of the at least two IC dies 220 partially underlies the bottom die 110, and partially extends beyond the bottom die 110. The package substrate 102 has contacts 108. The contacts 108 of the package substrate 102 are connected by solder balls 270, copper posts or conductive spacers to the second pads 260, which are in turn connected (by conductors 240) to the first pads 250 of the at least two IC dies 220.

The structure of FIG. 3 includes a plurality of SiP units connected to each other by the medium 202 (e.g., molding compound) encapsulating the IC dies 220. Thus, the various die units 100 are placed over the IC dies 220 at the fan-out (reconfigured) wafer level, prior to singulating the fan-out wafer 200 to separate the individual assemblies 201 from each other.

Figure 4:
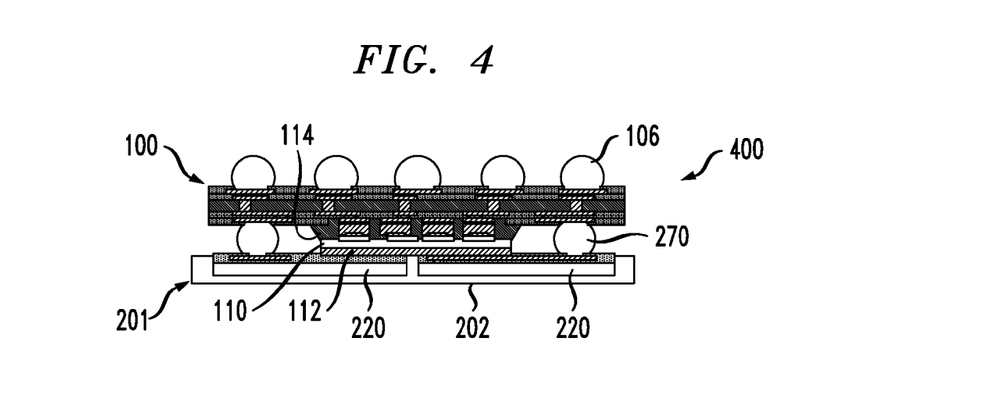
FIG. 4 is a diagram showing a system in package (SiP) singulated from the assembly of FIG. 3

At step 908 of FIG. 9, after forming the interconnections between the IC dies 220 and the contacts 108 of package substrate 102, the fan-out wafer 200 is cut, so as to separate each of the die units 100 from each other one of the die units (and separate each of the assemblies 201 from each other). The resulting SiP configuration 400 is shown in FIG. 4. The cutting may be performed by any appropriate tool, such as a laser, die saw, or ultrasonic die cutter, for example.

At step 910, an underfill material 402 is applied between the package substrate 102 and the redistribution layer 203. The underfill material 402 may be the same material as molding compound 202, or a different underfill material. The resulting structure is shown in FIG. 5.

Figure 5:
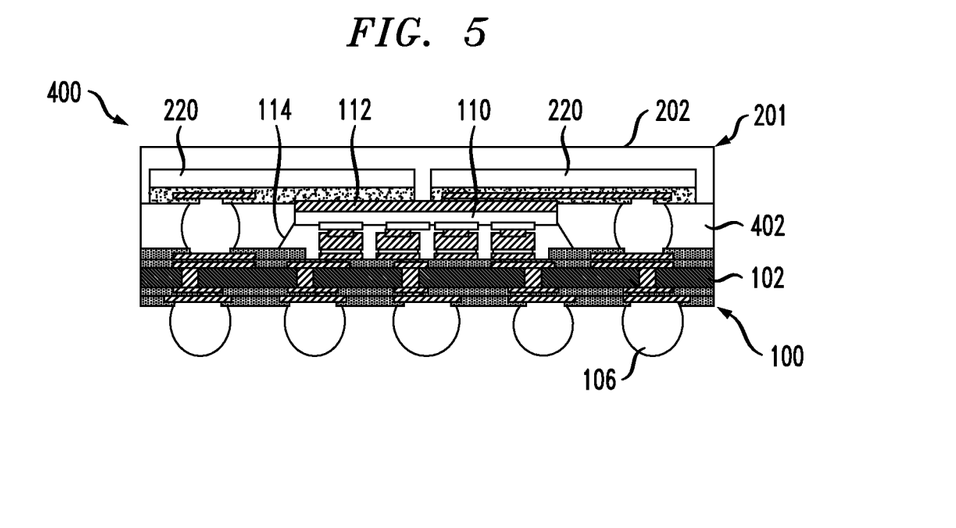
FIG. 5 shows the SiP of FIG. 4 after encapsulation with molding compound.

In some embodiments, the package is complete as shown in FIG. 5, with the back faces 222 of the IC dies 220 encapsulated within the molding compound 202.

In other embodiments, an additional thinning step 912 is performed after step 910. In step 912, the back surface of the fan-out wafer 200 is thinned by grinding or chemical-mechanical polishing, for example, until the back faces of at least one, some or all of the IC dies 220 are exposed, as shown in FIGS. 6 and 8B.

In some embodiments, a method comprises: (a) providing a fan-out wafer having a plurality of integrated circuit (IC) dies fixed in a medium, the fan-out wafer having a redistribution layer over the IC dies, the redistribution layer having conductors connecting first pads of the IC dies to second pads at an exposed surface of the fan-out wafer; (b) mounting a plurality of die units over respective IC dies of the fan out wafer, each die unit having a package substrate with contacts and a bottom die, (c) connecting the contacts of each package substrate to ones of the second pads corresponding to at least one respective IC die; and (d) after step (c), cutting the fan-out wafer, so as to separate the at least one IC die connected to each package substrate from the IC dies connected to each other package substrate.

In some embodiments, a method comprises: (a) providing a fan-out wafer having a plurality of integrated circuit (IC) dies fixed in a medium, the fan-out wafer having a redistribution layer over the IC dies, the redistribution layer having conductors connecting first pads on the IC dies to second pads at an exposed surface of the fan-out wafer; (b) mounting a die unit over at least two of the IC dies, the die unit having a bottom die interconnected to a package substrate, respective portions of the redistribution layer corresponding to each of the at least two IC dies partially underlying and extending beyond the bottom die; (c) connecting contacts of the package substrate to ones of the second pads corresponding to at least two of the IC dies; and (d) cutting the fan-out wafer, so as to separate the at least two IC dies from any remaining IC dies of the fan-out wafer.

In some embodiments, a structure comprises an assembly having at least one integrated circuit (IC) die fixed in a medium. The assembly has a redistribution layer over the IC die. The redistribution layer has conductors connecting first pads on active faces of the IC dies to second pads at an exposed surface of the assembly. A die unit over the at least one IC die has a bottom die interconnected to a package substrate. Respective portions of the redistribution layer corresponding to each of the at least one IC die partially underlie the bottom die, and extend beyond the bottom die. The package substrate has contacts connected to the ones of the second pads corresponding to the at least one IC die.

Although the subject matter has been described in terms of exemplary embodiments, it is not limited thereto. Rather, the appended claims should be construed broadly, to include other variants and embodiments, which may be made by those skilled in the art.

What is claimed is:

1. A method comprising:
  (a) providing a fan-out wafer having a plurality of integrated circuit (IC) dies fixed in a medium, the fan-out wafer having a redistribution layer over the IC dies, the redistribution layer having conductors connecting first pads of the IC dies to second pads at an exposed surface of the fan-out wafer;
  (b) mounting a plurality of die units over respective IC dies of the fan out wafer, each die unit having a package substrate with contacts and a bottom die,
  (c) connecting the contacts of each package substrate to ones of the second pads corresponding to at least one respective IC die; and
  (d) after step (c), cutting the fan-out wafer, so as to separate the at least one IC die connected to each package substrate from the IC dies connected to each other package substrate.

2. The method of claim 1, wherein:
  step (b) comprises mounting one of the die units over at least two of the IC dies; and
  step (c) comprises connecting the contacts of the package substrate of the one die unit to the first pads of the at least two of the IC dies.

3. The method of claim 2, wherein respective portions of the redistribution layer corresponding to each of the at least two IC dies partially underlies the bottom die of the one die unit, and partially extends beyond the bottom die.

4. The method of claim 3, wherein the bottom die is a processor, and the at least two dies include a plurality of dynamic random access memory dies.

5. The method of claim 1, further comprising:
  applying an underfill material between the package substrate and the redistribution layer.

6. The method of claim 1, further comprising:
  (e) thinning a back surface of the medium after step (d).

7. The method of claim 6, wherein:
  prior to step (d), the fan-out wafer has a thickness greater than a thickness of at least one of the IC dies, the method, and
  after step (e), a back face of at least one of the IC dies is exposed.

8. The method of claim 1, wherein each of the plurality of IC dies is surrounded on four sides by the medium.

9. The method of claim 8, wherein the medium is a molding compound.

10. The method of claim 1, wherein the bottom die is a known good die, and step (a) further comprises performing chip probe testing of the plurality of IC dies.

11. A method comprising:
(a) providing a fan-out wafer having a plurality of integrated circuit (IC) dies fixed in a medium, the fan-out wafer having as redistribution layer over the IC dies, the redistribution layer having conductors connecting first pads on the IC dies to second pads at an exposed surface of the fan-out wafer;
(b) mounting a die unit over at least two of the IC dies, the die unit having a bottom die interconnected to a package substrate, respective portions of the redistribution layer corresponding to each of the at least two IC dies partially underlying and extending beyond the bottom die;
(c) connecting contacts of the package substrate to ones of the second pads corresponding to at least two of the IC dies; and
(d) cutting the fan-out wafer, so as to separate the at least two IC dies from any remaining IC dies of the fan-out wafer.

12. The method of claim 11, wherein the bottom die is a processor, and the at least two dies include a plurality of dynamic random access memory dies.

13. The method of claim 11, further comprising:
applying an underfill material between the package substrate and the redistribution layer.

14. The method of claim 11, further comprising:
(e) thinning a back surface of the medium after step (d).

15. The method of claim 14, wherein:
prior to step (d), the fan-out wafer has a thickness greater than a thickness of at least one of the IC dies, the method, and
after step (e), a back face of at least one of the IC dies is exposed.

16. The method of claim 11, wherein step (d) is performed after step (b).

17. The method of claim 1, wherein:
step (b) includes disposing the bottom die of each die unit between the fan-out wafer and the package substrate of that die unit; and
the contacts of each package substrate are on a side of the package substrate facing the fan-out wafer.

18. The method of claim 11, wherein:
step (b) includes mounting the die unit over four IC dies with each respective corner of the bottom die overlying a respective corner of a respective IC die of the fan-out wafer.

19. New The method of claim 18, wherein step (c) includes connecting contacts which form a ring extending around the bottom die.

20. The method of claim 18, wherein each respective one of the four IC die of the fan out wafer has an L-shaped configuration of second pads.

* * * * *

UNITED STATES PATENT AND TRADEMARK OFFICE
CERTIFICATE OF CORRECTION

PATENT NO.       : 8,597,986 B2
APPLICATION NO.  : 13/223428
DATED            : December 3, 2013
INVENTOR(S)      : Tsung-Ding Wang et al.

It is certified that error appears in the above-identified patent and that said Letters Patent is hereby corrected as shown below:

In the Claims

Claim 11, Column 7, Line 12 - delete "as" and insert -- a --.

Claim 19, Column 8, Line 24 - delete "New".

Signed and Sealed this
Tenth Day of February, 2015

Michelle K. Lee
*Deputy Director of the United States Patent and Trademark Office*